(12) United States Patent
Erbetta et al.

(10) Patent No.: US 8,828,788 B2
(45) Date of Patent: Sep. 9, 2014

(54) FORMING ELECTRODES FOR CHALCOGENIDE CONTAINING DEVICES

(75) Inventors: Davide Erbetta, Trezzo sull'Adda (IT); Camillo Bresolin, Vimercate (IT); Andrea Gotti, Pozzo d'Adda-Milan (IT)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 12/777,419

(22) Filed: May 11, 2010

(65) Prior Publication Data
US 2011/0278531 A1 Nov. 17, 2011

(51) Int. Cl.
H01L 21/00 (2006.01)
H01L 47/00 (2006.01)
H01L 29/02 (2006.01)

(52) U.S. Cl.
USPC ........... 438/98; 438/95; 438/96; 257/2; 257/4

(58) Field of Classification Search
USPC ................................ 257/2, 4; 438/95, 96, 98
See application file for complete search history.

(56) References Cited

U.S. PATENT DOCUMENTS

| | | | | |
|---|---|---|---|---|
| 5,687,112 | A * | 11/1997 | Ovshinsky | 365/163 |
| 6,563,164 | B2 * | 5/2003 | Lowrey et al. | 257/314 |
| 7,456,420 | B2 * | 11/2008 | Cote et al. | 257/4 |
| 2006/0011902 | A1 * | 1/2006 | Song et al. | 257/4 |
| 2006/0278900 | A1 * | 12/2006 | Chang et al. | 257/248 |
| 2007/0008773 | A1 * | 1/2007 | Scheuerlein | 365/161 |
| 2007/0020799 | A1 * | 1/2007 | Choi et al. | 438/103 |
| 2007/0210296 | A1 | 9/2007 | Cote et al. | |
| 2007/0284635 | A1 | 12/2007 | Fournier | |
| 2009/0206318 | A1 * | 8/2009 | Ko et al. | 257/4 |
| 2009/0250677 | A1 * | 10/2009 | Savransky | 257/2 |
| 2011/0073832 | A1 | 3/2011 | Lim et al. | |

FOREIGN PATENT DOCUMENTS

| | | |
|---|---|---|
| DE | 10297015 T5 | 10/2004 |
| WO | 97/05665 | 2/1997 |
| WO | 97/15954 | 5/1997 |
| WO | 97/40499 | 10/1997 |
| WO | 2008/026081 | 3/2008 |

OTHER PUBLICATIONS

Office Action dated Jun. 28, 2012 for German Application No. 10 2011 101 192.0, with English Translation of Office Action.
Office Action received for Korean Application No. 10-2011-44224 dated Sep. 20, 2012.
Korean Office Action for Korean Application No. 10-2011-44224 mailed May 8, 2013.
Last Preliminary Rejection dated Aug. 21, 2013 for KR Application No. 10-2011-44224.
Notice of Rejection Ground dated Jun. 4, 2013 for JP Application No. 2011-103402.
First CN Office Action for Application No. 201110124687.6 issued Sep. 2, 2013.
TW Office Action and Search Report for Application No. 100116569 dated Oct. 15, 2013.
Notice of Rejection Ground for JP Application No. 2011-103402, Mailed Apr. 1, 2014.
Second CN Office Action for Application No. 201110124687.6 issued May 27, 2014.

* cited by examiner

*Primary Examiner* — Karen Kusumakar
(74) *Attorney, Agent, or Firm* — Dorsey & Whitney LLP

(57) ABSTRACT

The electrode of a phase change memory may be formed with a mixture of metal and a non-metal, the electrode having less nitrogen atoms than metal atoms. Thus, in some embodiments, at least a portion of the electrode has less nitrogen than would be the case in a metal nitride. The mixture can include metal and nitrogen or metal and silicon, as two examples. Such material may have good adherence to chalcogenide with lower reactivity than may be the case with metal nitrides.

11 Claims, 1 Drawing Sheet

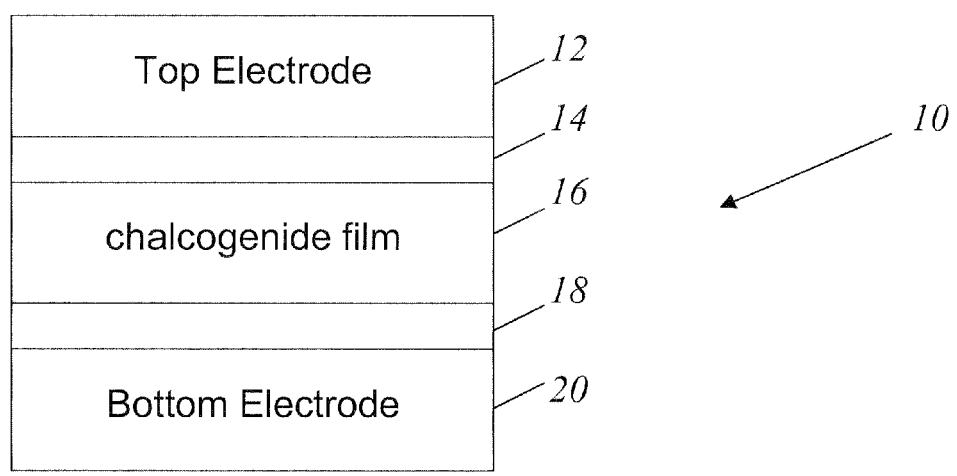

FORMING ELECTRODES FOR CHALCOGENIDE CONTAINING DEVICES

BACKGROUND

This relates generally to chalcogenide containing devices such as phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material.

Phase change memories include electrodes in contact with or in close proximity to chalcogenides. Where pure metal electrodes are used, those metals may react with the chalcogenide. However, many metals have very good adhesion to chalcogenide, including titanium.

BRIEF DESCRIPTION OF THE DRAWINGS

FIG. 1 is a schematic depiction of a chalcogenide containing semiconductor device in accordance with one embodiment.

DETAILED DESCRIPTION

In accordance with some embodiments, the electrodes for chalcogenide containing semiconductor devices may include a mixture of metal and another material that reduces the reactivity of the metal sufficiently to avoid deleterious reactions with the chalcogenide. At the same time, the nitrogen concentration of those electrodes is kept low enough to avoid adhesion problems between the electrode and other layers, such as chalcogenides. For example, in some embodiments, a relatively low nitrogen concentration, less than that used in metal nitrides, may be used to achieve both good adhesion and lower reactivity. As another example, nitrogen doped silicides or silicides alone may be used.

Referring to FIG. 1, a chalcogenide containing semiconductor device 10 may include a top electrode 12, a layer 14, a chalcogenide film 16, a layer 18, and a bottom electrode 20. The chalcogenide film 16 may be the active switching material used in a phase change memory element in one embodiment. As one example, the film 16 may be a germanium, antimony, tellurium alloy called GST. It may also be the chalcogenide used for an ovonic threshold switch, as another example.

The top and bottom electrodes 12 and 20 may be formed of conventional metals, such as titanium, to give one example, and tantalum, to give another example. They may also be formed of metal nitrides in some embodiments.

Either or both of the layers 14 and 18 may be formed of mixtures of metal and another material that reduces the reactivity of the metal relative to chalcogenide. For example, a relatively low concentration of nitrogen may be included, the concentration being below the one-to-one atomic ratio of metal and nitrogen of metal nitrides (also known as full nitridation). For example, in some embodiments, about a 30 to 40 percent nitrogen-to-metal atomic ratio may be utilized. As another example, a metal silicide that is a mixture of metal and silicon may be utilized. For example, titanium silicide may be utilized in some embodiments.

In some cases, the mixture of metal and another material may reduce the reactivity of the metal with chalcogenide compared to pure metal and may improve the adhesion relative to metal nitrides. Nitrogen doped silicides and undoped silicides, as well as metal doped with less than 50 atomic percent nitrogen, may be used in some embodiments.

Pure metals are extremely reactive with chalcogenide and also with silicon under a thermal budget. Nitrogen doping of metals reduces the reactivity of the metal with chalcogenides by reducing the chemical availability of metal atoms to react with chalcogenide. The result, in some embodiments, may be a metal mixture of sufficient reactivity to establish surface bonds at the interface between the doped metal and the chalcogenide, achieving adequate surface adhesion with lower reactivity to chalcogenide.

Moreover, in some embodiments, diffusion of the metal into the bulk of the chalcogenide may be reduced or eliminated, reducing contamination of the active switching material of the device 10 with unwanted chemical elements.

In some embodiments, nitrogen doped metal films may be formed using physical vapor deposition. Metal may be sputtered from a target to the wafer using argon gas. The argon gas flows in a process chamber and a plasma is created using a sufficiently high bias applied to the chamber. The argon is not substantially included in the deposited film during sputtering because it does not react with the metal. Nitrogen may be included in the film by flowing nitrogen into the process chamber with the argon, typically at a lower flow rate than the argon flow rate. Nitrogen is not a good sputtering gas, but reacts well with the metal sputtered by the argon plasma, resulting in the deposition of nitrogen doped metal without forming metal nitride as long as the nitrogen flow is maintained at a sufficiently low level. Full nitrodation of the metal may be avoided by keeping the flow sufficiently low, while still achieving adhesion of the mixture of metal and nitrogen with the chalcogenide.

In some embodiments, the electrode 12 and layer 14 and/or the electrode 20 and layer 18 may be formed successively in the same deposition chamber without venting between layers. In some embodiments, the layer 14 may be thinner than the electrode 12 and the layer 18 may be thinner than the electrode 20. For example, the layers 14 and 18 may be less than 100 Angstroms, in some embodiments, while the electrodes 12 and 20 may be greater than 300 Angstroms, in some embodiments. In some embodiments, the layers 14 and 18 directly contact the chalcogenide film 16.

Silicides can also be deposited using physical vapor deposition sputtering with pure argon plasma, in the case of undoped silicide, or with the inclusion of nitrogen as desired.

As used herein, the term "electrode layer" is used to refer to a conductive layer that conduct current through a chalcogenide layer. A resistive material that operates as heater to heat a chalcogenide and to cause phase change is not encompassed under the term "electrode layer" as used herein. An "electrode layer" as used herein has a resistivity of less than 200 μOhm centimeters. Thus, the layers 14 and 18 may be electrode layers.

In some embodiments, the same metal may be used in the electrode 12 and layer 14. Similarly, the same metal may be used in the electrode 20 and the layer 18. In some embodiments, the same metal may be used in electrodes 12 and 20 and layers 14 and 18.

Programming to alter the state or phase of the material may be accomplished by applying voltage potentials to the electrodes 12 and 20, thereby generating a voltage potential across a memory element including a chalcogenide film 16. When the voltage potential is greater than the threshold voltages of any select device and memory element, then an electrical current may flow through the chalcogenide film 16 in response to the applied voltage potentials, and may result in heating of the film 16.

This heating may alter the memory state or phase of the film 16, in one embodiment. Altering the phase or state of the film 16 may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

The ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistance state so that little or no electrical current passes.

Alternatively, if a voltage potential greater than the threshold voltage of the select device is applied across the device, then the device may turn on, i.e., operate in a relatively low resistance state so that significant electrical current passes through the switch. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material 16 that is a chalcogenide alloy. The switch material may be a material in a substantial amorphous state positioned between two electrodes that may be repeatedly and reversibly switched between a higher resistance off state that is generally greater than about 1 megaOhms and a relatively lower resistance on state that is generally less than about 1000 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a phase programmable material and, as a result, the switch may not be a memory device capable of storing information. For example, the switching material may remain permanently amorphous and the IV characteristics may remain the same throughout the operating life.

In the low voltage, low electric field mode, where the voltage applied across the switch is less than the threshold voltage $V_{th}$, the switch may be off or non-conducting and exhibits a relatively high resistance. The switch may remain in the off state until a sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

One or more MOS or bipolar transistors or one or more diodes (either MOS or bipolar) may be used as the select device. If a diode is used, the bit may be selected by lowering the row line from a higher deselect level. As a further non-limiting example, if an n-channel MOS transistor is used as a select device with its source, for example, at ground, the row line may be raised to select the memory element connected between the drain of the MOS transistor and the column line. When a single MOS or single bipolar transistor is used as the select device, a control voltage level may be used on a "row line" to turn the select device on and off to access the memory element.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first electrode and a second electrode;
a chalcogenide layer between the first and second electrodes; and
a first electrode layer thinner than the first electrode and disposed between the first electrode and the chalcogenide layer and a second electrode layer thinner than the second electrode and disposed between the second electrode and the chalcogenide layer, each of the first and second electrode layers including a mixture of a metal and nitrogen, wherein an atomic percentage of the nitrogen of the mixture of metal and nitrogen includes 30 to 40 atomic percent, wherein an atomic percent of the metal of the mixture of metal and nitrogen is 100 minus the atomic percentage of the nitrogen.

2. The apparatus of claim 1 wherein said chalcogenide layer is part of a memory element.

3. The apparatus of claim 1 wherein said chalcogenide layer is part of an ovonic threshold switch.

4. A method comprising:
forming a chalcogenide containing device which includes: a first and second electrodes, a chalcogenide layer between the first and second electrodes, and first and second electrode layers, respective ones of the first and second electrode layers disposed between the chalcogenide layer and respective ones of the first and second electrodes, wherein the first and second electrode layers each include a mixture of metal and nitrogen, wherein an atomic percentage of the metal of the mixture of metal and nitrogen is 100 minus an atomic percentage of the nitrogen of the mixture of metal and nitrogen.

5. The method of claim 4, wherein forming includes forming the first and second electrodes and the first and second electrode layers by sputtering.

6. The method of claim 5, wherein the first electrode and first electrode layer and/or the second electrode and second electrode layer are formed successively in the same deposition chamber without venting between layers.

7. The method of claim 4 including forming a phase change memory.

8. The method of claim 4 including forming an ovonic threshold switch.

9. The apparatus of claim 1 wherein the at least one of the first and second electrodes includes a second metal which is the same as the metal in the mixture of a respective one of the first or second electrode layer.

10. The apparatus of claim 1 wherein each of the first and second electrode layers have a resistivity of less than 200 µOhm centimeters.

11. The method of claim 4 wherein each of the first and second electrode layers have a resistivity of less than 200 µOhm centimeters.

* * * * *